United States Patent [19]
Lin

[11] Patent Number: 5,895,975
[45] Date of Patent: Apr. 20, 1999

[54] OPTIMIZED PROCESS FOR CREATING AND PASSIVATING A METAL PILLAR VIA STRUCTURE LOCATED BETWEEN TWO METAL INTERCONNECT STRUCTURES

[75] Inventor: Yung-Fa Lin, Hsin-Chu, Taiwan

[73] Assignee: Taiwan Semiconductor Manufacturing Company, Ltd., Hsin-Chu, Taiwan

[21] Appl. No.: 08/856,783

[22] Filed: May 15, 1997

Related U.S. Application Data

[62] Division of application No. 08/663,572, Jun. 13, 1996, Pat. No. 5,663,108.

[51] Int. Cl.$^6$ ............................................. H01L 23/48
[52] U.S. Cl. ........................... 257/758; 257/760; 257/765
[58] Field of Search .............................. 257/762, 763, 257/765, 758, 760, 303, 308, 637

[56] References Cited

U.S. PATENT DOCUMENTS

| | | | |
|---|---|---|---|
| 4,917,759 | 4/1990 | Fisher et al. | 156/643 |
| 4,965,226 | 10/1990 | Gootzen et al. | 438/624 |
| 5,262,354 | 11/1993 | Cote et al. | 437/195 |
| 5,312,512 | 5/1994 | Allman et al. | 156/636 |
| 5,354,712 | 10/1994 | Ho et al. | 438/643 |
| 5,366,911 | 11/1994 | Lur et al. | 438/282 |
| 5,430,328 | 7/1995 | Hsue | 257/750 |
| 5,500,558 | 3/1996 | Hayashide | 257/758 |
| 5,517,062 | 5/1996 | Lur et al. | 257/760 |
| 5,567,987 | 10/1996 | Lee | 257/751 |
| 5,635,763 | 6/1997 | Inoue et al. | 257/763 |
| 5,639,692 | 6/1997 | Teong | 438/624 |
| 5,641,994 | 6/1997 | Bollinger et al. | 257/771 |
| 5,646,449 | 7/1997 | Nakamura et al. | 257/761 |
| 5,654,216 | 8/1997 | Adrian | 438/627 |
| 5,672,914 | 9/1997 | Huang et al. | 257/763 |
| 5,723,380 | 3/1998 | Wang et al. | 438/624 |

*Primary Examiner*—Valencia Martin-Wallace
*Assistant Examiner*—George C. Eckert, II
*Attorney, Agent, or Firm*—George O. Saile; Stephen B. Ackerman

[57] ABSTRACT

A metal pillar via structure, formed in a composite dielectric layer, contacting an underlying first level metallization structure, and contacting an overlying second level metallization structure, has been developed. The sides of the metal pillar via structure are first encapsulated with insulator sidewall spacers, and than by a composite dielectric layer, with the top surface of the metal pillar via structure, planar with the top surface of the composite dielectric layer. The metal pillar via structure is comprised of a refractory metal such as tungsten.

5 Claims, 5 Drawing Sheets

5,895,975

1

OPTIMIZED PROCESS FOR CREATING AND PASSIVATING A METAL PILLAR VIA STRUCTURE LOCATED BETWEEN TWO METAL INTERCONNECT STRUCTURES

This application is a divisional of Ser. No. 08/663,572, filed Jun. 13, 1996, now U.S. Pat. No. 5,663,108 assigned to the same assignee as the current invention.

BACKGROUND OF THE INVENTION (1) Field of the Invention

This invention relates to processes used to manufacture semiconductor devices, and more specifically to processes used to create metal vias, used to interconnect metallization levels.

(2) Description of Prior Art

The semiconductor industry is continually attempting to provide the customer with higher performing silicon devices, while still maintaining, or even decreasing the cost of silicon chips. These objectives have been met by the semiconductor industry achieving micro-miniaturazation, or the ability to successfully create sub-micron device features. Significant advances in specific semiconductor fabrication disciplines, such as photolithography and dry etching, have allowed micro-miniaturazation to become reality. For example more sophisticated exposure cameras, as well as the development of more sensitive photoresist materials, have allowed sub-micron images in photoresist layers to be created. Similar advances in anisotropic, reactive ion etching, (RIE), has resulted in the sub-micron images in the overlying photoresist layer, being successfully defined in underlying materials, used for the fabrication of semiconductor devices.

However as specific features are reduced in size, several new concerns, not encountered with devices fabricated using less aggressive groundrules, are created. For example via holes in an interlevel dielectric material, used to interconnect metallization levels, when filled with a via metal, are difficult to properly fill due to the decreasing diameter of the via hole. The conformality of the depositing via metal decreases as the dimensions of the via hole shrink. Lack of metal in the via hole can result in significant reliability problems in terms of electromigration. In addition the narrower spaces between metal lines present problems when using standard insulator processes to fill these sub-micron spaces. The problems encountered with sub-micron features, namely the difficulty in filling narrow via holes with metal, as well as filling narrow spaces, between metal structures with insulator, have been addressed. For example Allman, et al, in U.S. Pat. No. 5,312,512, Fisher, et al, in U.S. Pat. No. 4,917,759, and Cote, et al, in U.S. Pat. No. 5,262,354, have described methods for creating narrow metal vias, as well as methods for insulator filling of narrow spaces between metal structures. However this invention will describe a fabrication process that offers a more complete solution to the sub-micron metal and insulator fill situation.

SUMMARY OF THE INVENTION

It is an object of this invention to consecutively deposit metallization layers for both an underlying interconnect structure, and an overlying metal pillar via structure.

It is another object of this invention to create a narrow, metal pillar via structure on an underlying metallization interconnect structure.

It is still another object of this invention to fill the narrow spaces between metal pillar structures with a composite dielectric material, with one of the layers being a spin on glass material.

2

It is still yet another object of this invention to remove the composite dielectric material, from the top surface of the metal pillar structure, via a chemical mechanical polishing process.

In accordance with the present invention a method is described for forming via interconnects, using metal pillar via structures, and using spin on glass and chemical mechanical polishing for passivation and planarization purposes. A dual deposition, consisting of a first metallization layer, to be used for the first level interconnect structure, followed by a second metallization layer, to be used for the metal pillar via structure, is performed on an underlying semiconductor substrate. Patterning is performed to create the desired first level interconnect structure in the dual metallization layers. A dielectric layer is deposited and subjected to a anisotropic, dry etching procedure, to create an insulator sidewall spacer on the sides of the etched dual metallization structure. Another patterning procedure is then performed on the second metallization layer, via selective, anisotropic dry etching processing, to create a metal pillar via structure. A composite dielectric material is next deposited, using a spin on glass as one of the components of the composite dielectric material, for purposes of filling the narrow spaces between metal pillar via structures. After a bakeout and curing procedure, applied to remove volatile components from the spin on glass layer, a chemical mechanical polishing procedure is used for planarization purposes, and to expose the top surface of the metal pillar via structure. A third metallization layer is then deposited and patterned to create the second level interconnect structure, connected to the first level interconnect structure by the metal pillar via structure.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

The method of forming metal pillar via structures, and the passivation and planarization process used, will now be covered in detail. This invention can be applied to metallization interconnects used for fabricating MOSFET devices now being manufactured in industry, therefore only the specific areas, unique to understanding this invention will be covered in detail.

Figure 1:
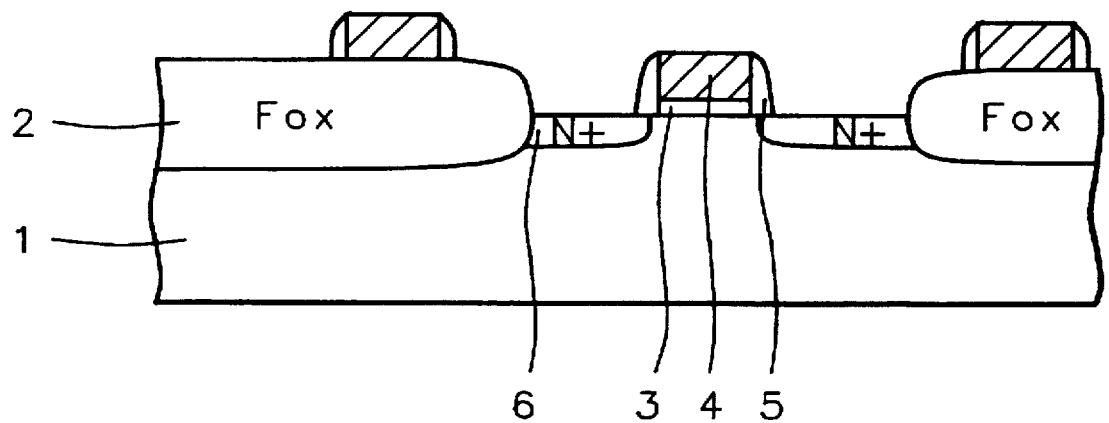
FIG. 1, which schematically, in cross-sectional style, shows a standard metal oxide semiconductor field effect transistor, (MOSFET), device, prior to metallization processing.

An N channel, MOSFET device, in which the optimized metal pillar via process will be applied to, is shown in FIG. 1. A P type, single crystalline silicon substrate, 1, with a <100> crystallographic orientation, is used. Thick field oxide regions, (FOX), 2, are created for purposes of device isolation. Briefly the process used to create the FOX regions is to initially form an oxidation mask, consisting of an overlying, chemically vapor deposited, silicon nitride layer, used as the oxidation mask, and an underlying thermally grown, silicon dioxide layer, used to buffer the stress of the overlying silicon nitride layer, during the subsequent FOX process. The composite mask is patterned using conventional photolithographic and reactive ion etching, (RIE) processing. After photoresist removal, using plasma oxygen ashing, the FOX regions are created by oxidation in an oxygen—steam ambient, at a temperature between about 900 to 1050° C., to a thickness between about 4000 to 6000 Angstroms. After removal of the masking layers, using hot phosphoric acid for silicon nitride and a buffered hydrofluoric acid solution for the underlying silicon dioxide layer, a silicon dioxide, gate insulator, 3, is thermally grown at a temperature between about 800 to 1000° C., in an oxygen—steam ambient, to a thickness between about 50 to 300 Angstroms. Next a layer of polysilicon is deposited using low pressure chemical vapor deposition, (LPCVD), processing, at a temperature between about 600 to 800° C., to a thickness between about 2000 to 4000 Angstroms. The polysilicon layer is next subjected to an ion implantation of phosphorous, at an energy between about 50 to 100 Kev, at a dose between about 5E14 to 1E16 atoms/cm$^2$. Standard photolithographic and RIE processes, using a $Cl_2$ based gas as an etchant, are used to create polysilicon gate structure, 4, shown schematically in FIG. 1. After photoresist removal, via use of plasma oxygen ashing, followed by wet cleans, a silicon oxide layer is deposited, using either LPCVD or plasma enhanced chemical vapor deposition, (PECVD), processing. The silicon oxide layer is grown at a temperature between about 500 to 800° C., to a thickness between about 1000 to 4000 Angstroms, using tetraethylorthosilicate as a source. A selective, anisotropic, RIE procedure, using $CHF_3$ as an etchant, is used to create insulator sidewall spacer, 5. An ion implantation of arsenic, at an energy between about 50 to 100 Kev., at a dose between about 5E13 to 5E14 atoms/cm$^2$, is used to form source and drain regions, 6, shown in FIG. 1.

Figure 2:
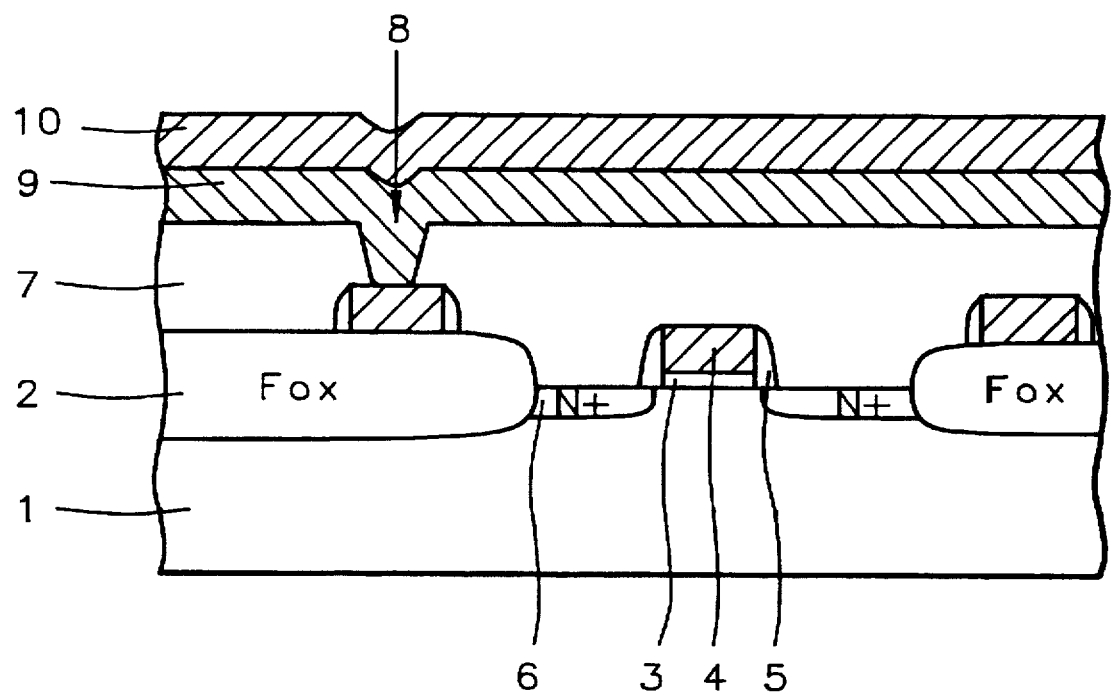
FIGS. 2–3, which in cross-sectional form, show the formation of the first level interconnect structure.

FIG. 2, shows the deposition of a silicon oxide layer, 7, obtained using either LPCVD or PECVD processing, grown at a temperature between about 500 to 800° C., to a thickness between about 5000 to 7000 Angstroms. A contact hole, 8, is created in silicon oxide layer, 7, to expose the top surface of polysilicon gate structure, 4. This is accomplished using conventional photolithographic and RIE procedures, using $CHF_3$ as an etchant. Photoresist removal is again accomplished using plasma oxygen ashing, followed by careful wet cleans. Consecutive metal depositions are next performed for purposes of subsequent creation of an underlying first level interconnect structure, and a metal pillar via structure. The first metal layer, 9, to subsequently be used for forming a first level interconnect structure, is aluminum, containing between about 1 to 3% copper, and between about 1 to 2% silicon, deposited using r.f. sputtering, to a thickness between about 5000 to 10000 Angstroms. The second metal layer, 10, to subsequently be used for construction of a metal pillar via structure, is tungsten, deposited again using r.f. sputtering, or LPCVD processes. The thickness of tungsten layer, 10, is between about 5000 to 6000 Angstroms.

Figure 3:
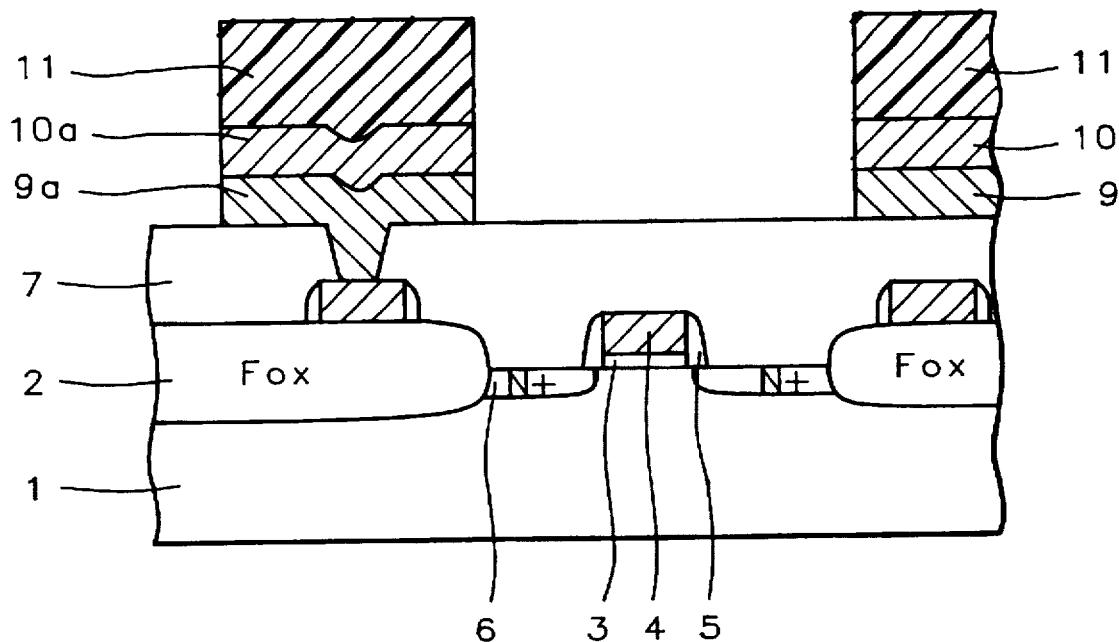
Figure 4:
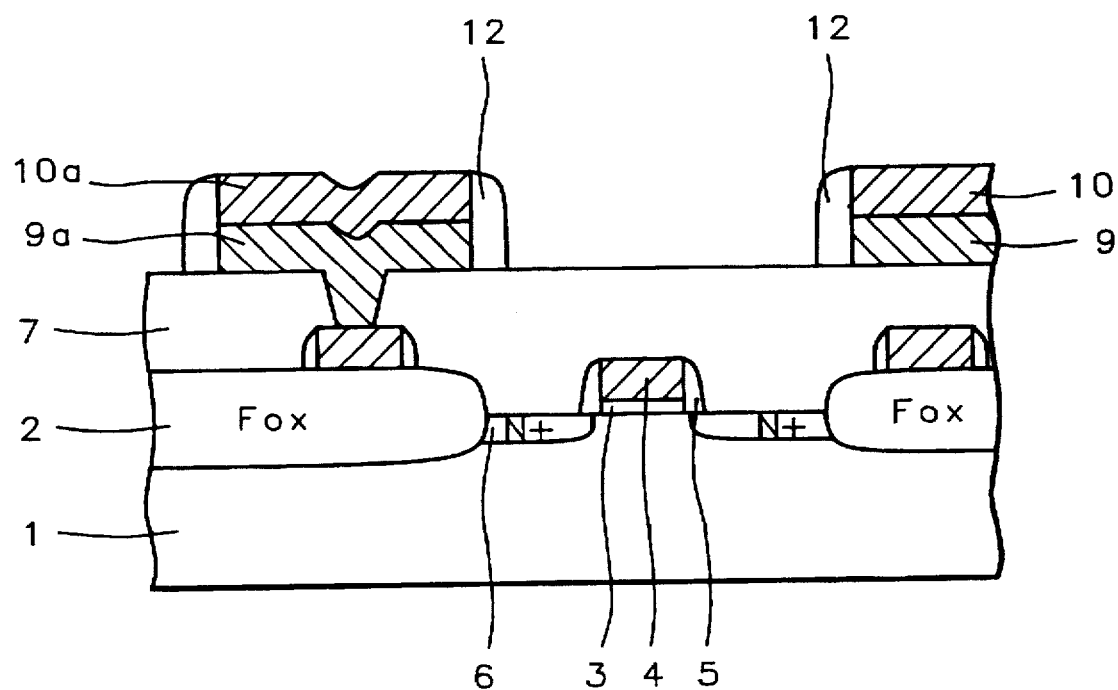
FIG. 4, which in cross-sectional style, indicates the formation of the insulator sidewall spacer on the exposed sides of the metallization structure.

A photolithographic procedure is employed to form photoresist shape, 11, shown schematically in FIG. 3. A RIE procedure, using $NF_3$ is used to etch tungsten layer, 10, producing tungsten shape 10a, while $Cl_2$ is used to etch the underlying aluminum based layer, 9. The shape created in the dual metal layers is the shape desired for the first level interconnect structure, 9a. Photoresist removal is next performed using plasma oxygen ashing, followed by careful wet cleans. A PECVD, silicon oxide layer, is next deposited at a temperature between about 400 to 600° C., to a thickness between about 1000 to 2000 Angstroms. An insulator sidewall spacer, 12, is then created on the exposed sides of the metal structure, 9a, and metal structure, 10a, via anisotropic RIE procedures using $CHF_3$ as an etchant. This is shown schematically in FIG. 4.

Figure 5A:
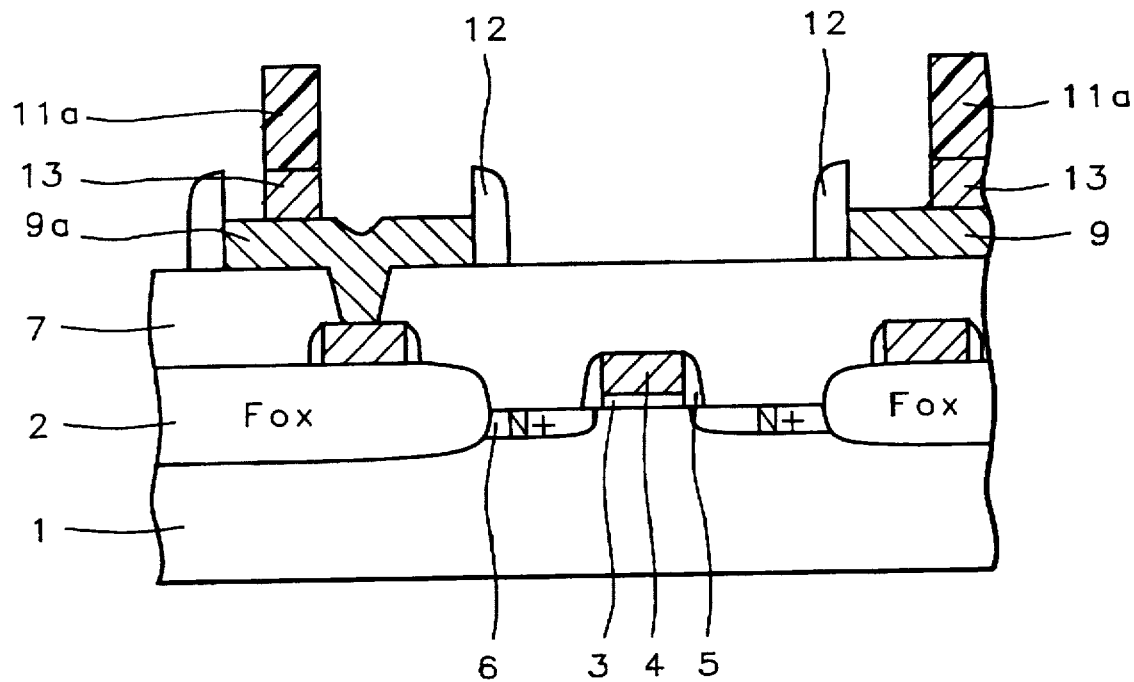
FIGS. 5a–5b, which in cross-sectional form, show two views of a metal pillar via structure on an underlying first level interconnect structure.
Figure 5B:
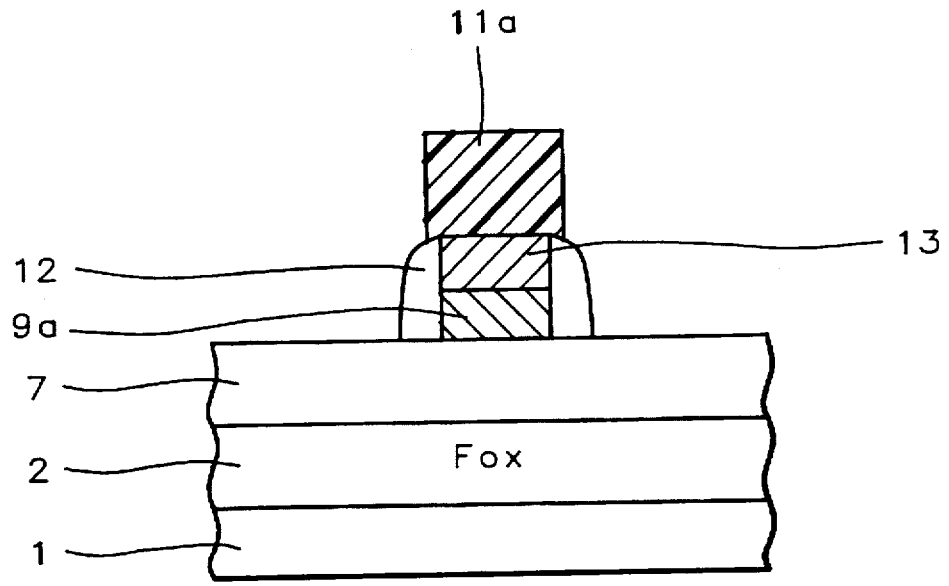

A critical photolithographic and RIE procedure is next used to create metal pillar via structure, 13, shown schematically, in cross-sectional style in FIG. 5a, and shown schematically, in cross-sectional style, in FIG. 5b, but offset 90 degrees, when compared to FIG. 5a. Photoresist shape, 11a, is used to define the needed metal pillar via structure. The RIE etchant used to define metal pillar via structure, 13, is $NF_3$, which will provide the needed selectivity between tungsten, and the underlying first level interconnect, aluminum based structure, 9a. Without having a selectivity of between about 3 to 1, tungsten to aluminum etch rate, the underlying first level interconnect structure would be severely thinned at the conclusion of the metal pillar via structure sequence, which includes a tungsten overetch sequence to insure complete tungsten removal. FIG., 5a shows the tungsten metal pillar via structure, 13, post photoresist removal, which was accomplished using plasma oxygen ashing, followed by wet chemical cleans. The importance of insulator sidewall spacer, 12, can be seen in FIG. 5b, where the metal pillar via structure is defined on the narrow section, or the width of first level interconnect structure, 9a. Without the ability to place photoresist shape, 11a, slightly overlapping insulator sidewall spacer, 12, gouging from the subsequent RIE procedure, may occur, producing a topography that would present coverage problems for subsequent metallizations.

Figure 6:
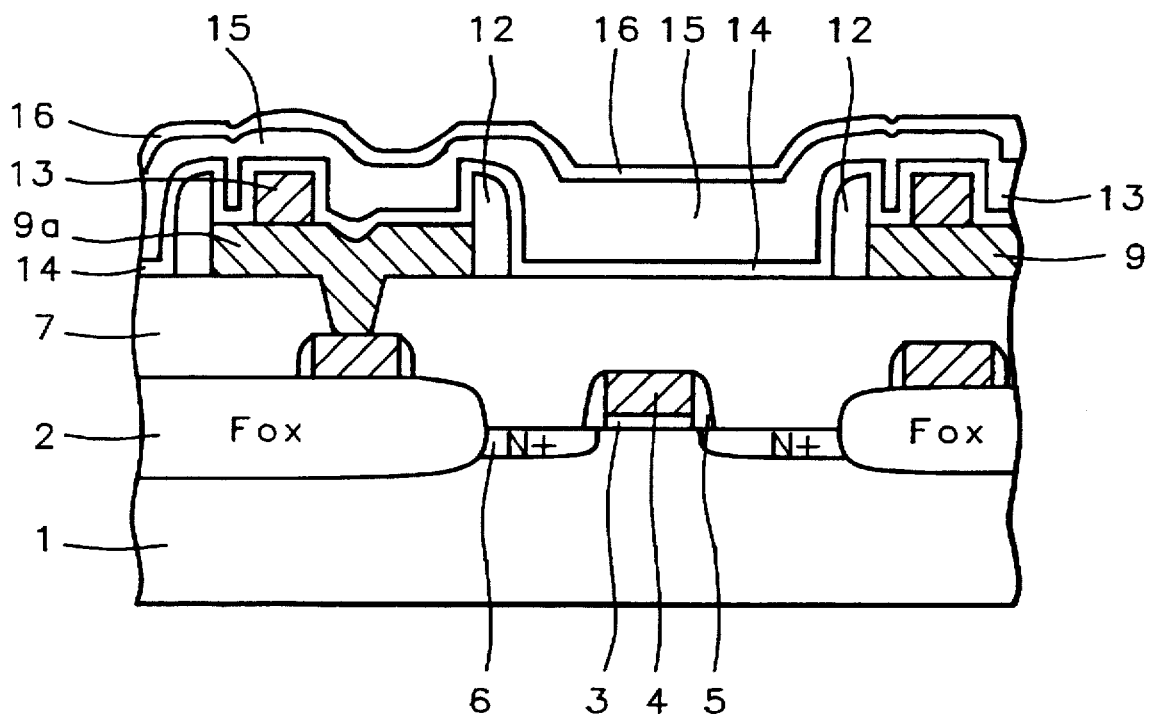
FIGS. 6–7, which in cross-sectional style, show the passivation and planarization stages of this process.
Figure 7:
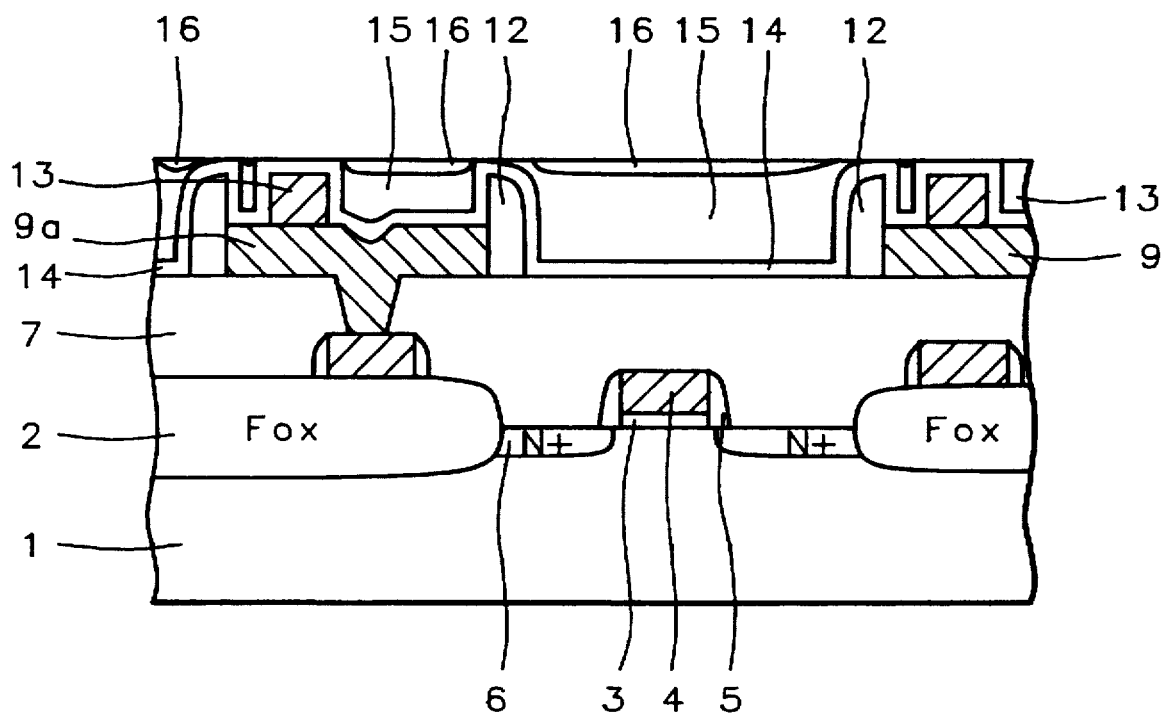

The passivation and filling of the narrow spaces between metal pillar via structures, 13, is next addressed. A first plasma, silicon oxide layer, 14, is deposited using PECVD processing, at a temperature between about 400 to 600° C., to a thickness between about 1000 to 2000 Angstroms. This layer offers the necessary passivation for first level interconnect structure, 9a, as well as for metal pillar via structure, 13. Next a spin on glass, (SOG), 15, is applied using siloxane, to a thickness between about 6000 to 8000 Angstroms. The properties of the SOG material allow the narrow spaces between metal pillar via structures to be adequately filled. A bakeout procedure at a temperature between about 200 to 300° C., and a curing procedure, at a temperature between about 300 to 400° C., are employed to remove volatile components from SOG layer, 15, that if left unremoved may outgas during subsequent processing steps, perhaps attacking adjacent metallization structures. Finally a second plasma oxide layer, 16, is deposited using PECVD processing, at a temperature between about 400 to 600° C., to a thickness between about 6000 to 8000 Angstroms. The results of these passivation procedures are shown schematically in FIG. 6. Chemical mechanical polishing, (CMP), is performed to produce the desired planarity, and performed to a level in which the top surface of metal pillar via structure, 13, is exposed. This is shown schematically in FIG. 7.

Figure 8A:
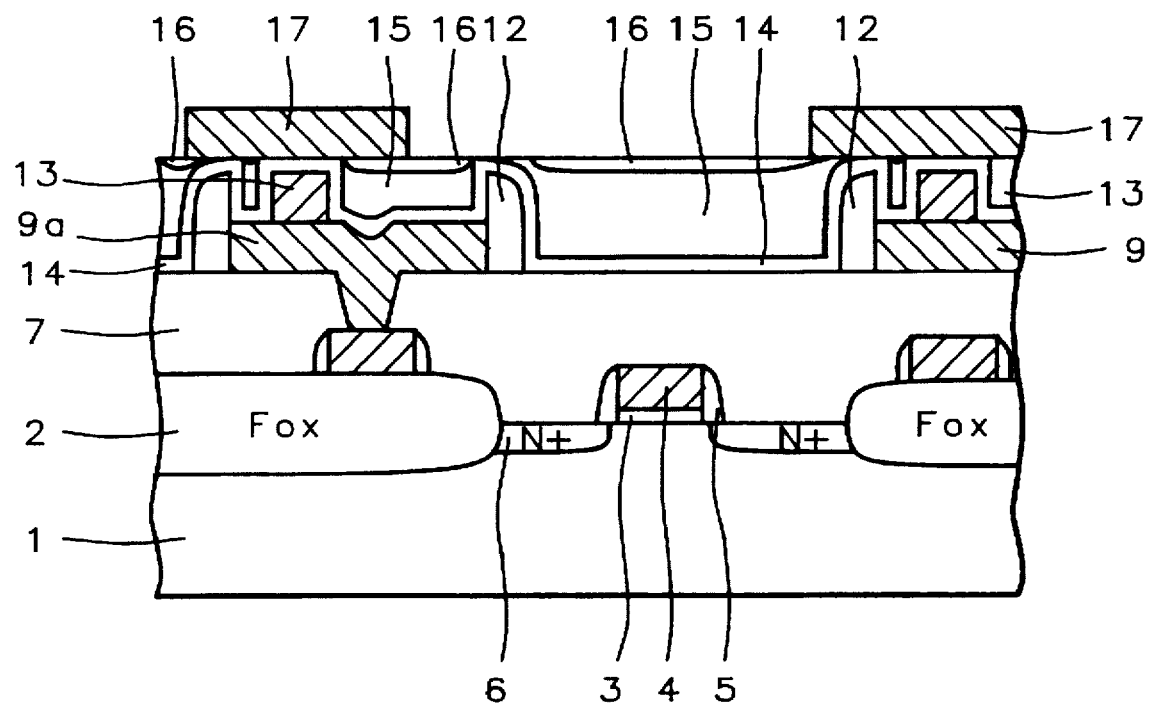
FIGS. 8a–8b, which schematically, in cross-sectional style, show two views of a second level interconnect structure, connected to an underlying first level interconnect structure, by use of a metal pillar via structure.
Figure 8B:
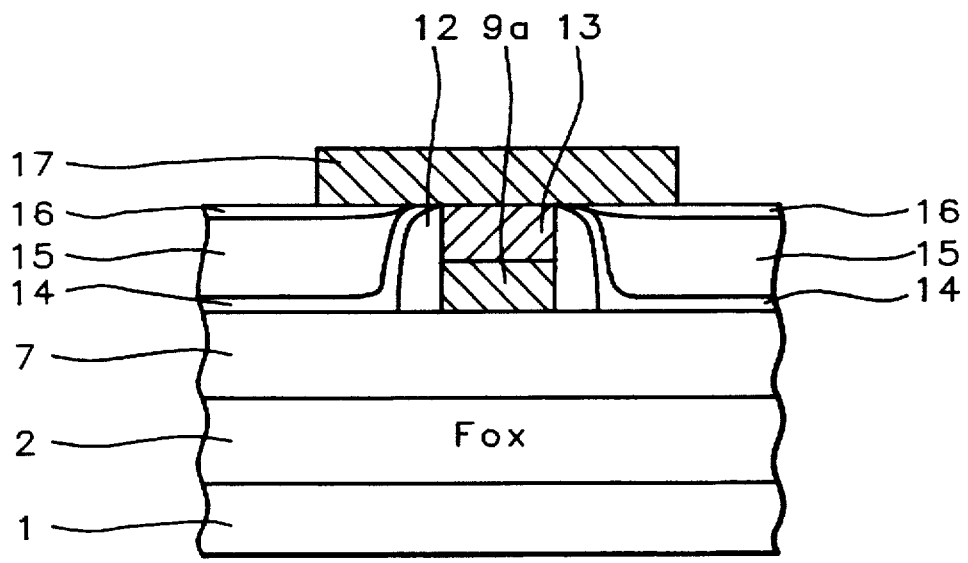

FIGS. 8a–8b, indicate the fabrication of a second level interconnect structure, 17, electrically connected to underlying first level interconnect structure, 9a, by use of a metal pillar via structure, 13. The second level interconnect structure is fabricated by the r.f. sputter deposition of aluminum, containing between about 1 to 3% copper, at a thickness between about 5000 to 10000 Angstroms. Conventional photolithographic and RIE procedures, using a $Cl_2$ based etchant, are used to create second level metallization structure, 17, shown schematically in FIG. 8a, and again shown in FIG. 8b, using a cross-sectional schematic, 90 degrees offset from the section shown in FIG. 8a. Again photoresist removal was performed using plasma oxygen ashing, followed by careful wet cleans.

This process for an optimized metal via structure, although shown as part of a N channel device, can also be applied to P channel devices, CMOS, (N and P channel devices), BiCMOS, (bipolar and CMOS devices), as well to bipolar devices.

While this invention has been particularly shown and described with reference to, the preferred embodiments thereof, it will be understood by those skilled in the art that various changes in form and details may be made without departing from the spirit and scope of this invention.

What is claimed is:

1. A MOSFET device structure, comprising:

field oxide regions on the surface of a semiconductor substrate;

a device region between said field oxide regions;

a first polysilicon gate structure on said semiconductor substrate, in center of said device region;

a second polysilicon gate structure on a first field oxide region, and a third polysilicon gate structure on a second field oxide region;

first insulator sidewall spacers located on sides of said first polysilicon gate structure, on the sides of said second polysilicon gate structure, and on the sides of said third polysilicon gate structure;

source and drain regions in surface of said semiconductor substrate, between said first polysilicon gate structure, in said device region, and said field oxide regions;

an insulator layer, with a planar top surface topography, on said second polysilicon gate structure, on said first polysilicon gate structure, on said third polysilicon gate structure, on source and drain regions, and on said field oxide regions, not covered by polysilicon gate structures;

a contact hole in said insulator layer, to said second polysilicon gate structure, on said first field oxide region;

a first level metallization structure, contacting said second polysilicon gate structure, in said contact hole, and with said first level metallization structure extending to overlay said insulator layer, and another first level metallization structure on said insulator layer, in a region in which said insulator layer is directly overlying said third polysilicon gate structure;

a first metal pillar via structure, on the first level metallization structure, which contacts underlying, said second polysilicon gate structure, and a second metal pillar via structure, on the first level metallization structure that is located completely on said insulator layer, in the region in which said insulator layer is directly overlying said third polysilicon gate structure;

second insulator spacers on the sides of said first level metallization structures, and extending upwards to a level equal to the top surface of the metal pillar structures;

composite dielectric material in spaces between said second insulator spacers, that extend upwards from the sides of said first metallization structures, and said composite dielectric material also located in the spaces between said metal pillar via structures, and said second insulator spacers, that extend upwards from the sides of said first metallization structures, and with the top surface of said composite dielectric material, planar with the top surface of said metal pillar via structures; and a second level metallization structure, contacting top surface of said first metal pillar via structure, overlying said second polysilicon gate structure, and another second level metallization structure contacting the top surface of said second metal pillar via structure.

2. The MOSFET device structure of claim 1, wherein said first level metallization structure is aluminum, containing between 1 to 3% copper, and between about 1 to 2% silicon, at a thickness between 5000 to 6000 Angstroms.

3. The MOSFET device structure of claim 1, wherein said metal pillar via structure is tungsten, at a thickness between 5000 to 6000 Angstroms.

4. The MOSFET device structure of claim 1, wherein said composite dielectric material, used to fill spaces between said metal pillar via structures, and to fill spaces between said first level metallization structures is; an underlying plasma oxide layer, a spin on glass layer, and an overlying plasma oxide layer.

5. The MOSFET device structure of claim 1, wherein said second level metallization structure is aluminum, containing between 1 to 3% copper, at a thickness between 5000 to 10000 Angstroms.

* * * * *